United States Patent [19]

Suzuki

[11] 4,395,117
[45] Jul. 26, 1983

[54] PRINTING APPARATUS HAVING AN IN-FOCUS DETECTOR

[75] Inventor: Akiyoshi Suzuki, Kawasaki, Japan

[73] Assignee: Canon Kabushiki Kaisha, Tokyo, Japan

[21] Appl. No.: 242,349

[22] Filed: Mar. 10, 1981

[30] Foreign Application Priority Data

Mar. 18, 1980 [JP] Japan .................................. 55-34376

[51] Int. Cl.³ ........................ G03B 27/52; G03B 27/70
[52] U.S. Cl. ..................................... 355/43; 250/557; 250/575; 250/578; 355/45
[58] Field of Search ............ 354/25 A, 25 R; 355/43, 355/45, 57, 60–62, 65, 66, 41; 353/99, 101; 250/201, 557, 561, 575, 578, 235; 350/46, 50

[56] References Cited

U.S. PATENT DOCUMENTS 3,917,399 11/1975 Buzawa et al. ...................... 355/43

Primary Examiner—Richard A. Wintercorn
Attorney, Agent, or Firm—Fitzpatrick, Cella, Harper & Scinto

[57] ABSTRACT

A printing apparatus in which the image of a mask is projected onto a wafer by an imaging optical system and printed on the wafer. This apparatus has a detector for detecting the in-focus or lack of focus conditions of the mask image projected onto the wafer. This detector effects the detection by optically detecting the optical spacing between the mask and the wafer. The detection of such spacing is accomplished by causing a detection light to impinge on the wafer through a projection optical system and detecting the amount of displacement of the position of the reflected light in a plane optically parallel of the wafer.

4 Claims, 7 Drawing Figures

PRINTING APPARATUS HAVING AN IN-FOCUS DETECTOR

BACKGROUND OF THE INVENTION

1. Field of the Invention

This invention relates to a printing apparatus, and more particularly to a so-called projection type printing apparatus using an imaging optical system to form a mask image on a wafer.

2. Description of the Prior Art

The heretofore known projection type printing apparatuses include a one-shot exposure printing apparatus wherein the whole surface of a mask is exposed en bloc onto a wafer, a scanning type printing apparatus wherein a good image (usually an arcuate image) of part of a mask is projected onto a wafer and the mask and wafer are continuously moved in an orthogonal direction relative to the optical axis of the imaging system whereby the entire image of the mask is exposed onto the wafer, and a step and repeat printing apparatus wherein the image of a mask, on which a circuit pattern usually corresponding to one chip has been recorded, is formed on a wafer by a reduction projection optical system and the wafer is moved in a step-like fashion relative to the mask and the imaging optical system whereby exposure is effected during each movement of the wafer. As imaging optical systems, there are known both one which uses a refraction system (a so-called lens system) and one which uses a reflection system (a so-called mirror imaging system).

In these projection type printing apparatuses, any fluctuation of the spacing between the mask and the wafer which results from any change in room temperature, the nonplanarity of the wafer which results from the warping of the wafer, etc. causes the mask image on the wafer to be out of focus. For this reason, heretofore the spacing between the mask and the wafer has been measured by the use of an air sensor and one of the mask and wafer has been moved in the direction of the optical axis on the basis of the measured value to thereby make the spacing constant.

However, lack of focus of the mask image on the wafer results not only from any variation in the spacing between the mask and the wafer, but also from any fluctuation of the optical characteristic of the imaging optical system which in turn may result from expansion or contraction of the barrel of the imaging optical system due to any change in room temperature. Detection of such lack of focus cannot be accomplished by the use of the aforementioned air sensor.

The only possible way of detecting the lack of focus of the mask image caused by fluctuation of the optical characteristic has been to observe the mask and wafer images at a time through a microscope and detect the condition of their images.

SUMMARY OF THE INVENTION

It is an object of the present invention to provide a printing apparatus having an in-focus detector capable of detecting even the lack of focus of the mask image caused by any fluctuation of the optical characteristic of the imaging optical system.

Such object is achieved by effecting the detection of the spacing between the mask and the wafer with the imaging optical system taking part in it.

The spacing between the mask and the wafer in which the imaging optical system takes part is herein referred to as the optical spacing.

The invention will become more fully apparent from the following detailed description thereof taken in conjunction with the accompanying drawings.

DESCRIPTION OF THE PREFERRED EMBODIMENTS

Figure 1:
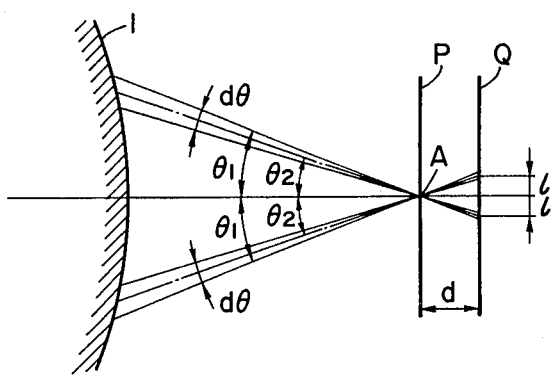
FIGS. 1 and 2 illustrate the principle of the in-focus detecting system applicable to the printing apparatus of the present invention.
Figure 2:
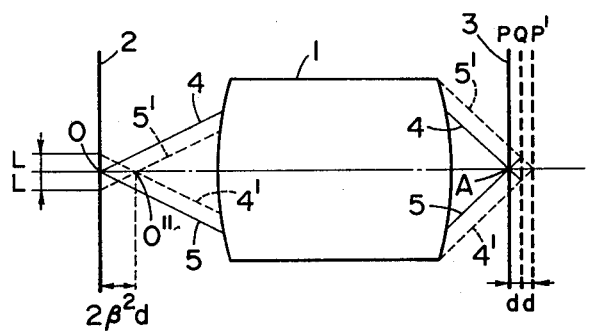

FIGS. 1 and 2 illustrate the principle of the in-focus point detecting mechanism of the printing apparatus according to the present invention. In the Figures, reference numeral 1 designates an imaging lens. Light from the object point on the optical axis of this lens 1 is imaged at a point of intersection A between the imaging plane P and the optical axis. The angle formed by the light flux imaged at the point A is $\pm\theta_1$ if the numerical aperture NA of the lens 1 is sin $\theta_1$. The detection method of the present invention divides the imaged light flux of a width $2\theta_1$ into several light fluxes and detects the focus position by the use of one or more of the divisional light fluxes. Description will be made by choosing as an example two divisional light fluxes each having a width $d\theta$ as shown in FIG. 1 and by using such two light fluxes. As shown in the cross-sectional view, the angle formed by the center of these thin light fluxes having the width $d\theta$ with the optical axis is $\theta_2$. These two light fluxes form imaged spots at the point of intersection between the imaging plane and the optical axis. The two light fluxes are in defocussed condition on a plane Q spaced apart a distance d from the plane P, and the positions whereat the two light fluxes intersect the plane Q are different positions symmetrical with respect to the optical axis. Accordingly, by detecting whether or not the two light fluxes coincide with each other, it is possible to discriminate the imaged condition of the light fluxes. The imaged condition may also be discriminated by using only a single light flux and judging whether or not the position whereat this light flux crosses the plane is on the optical axis.

Further, the spacing l between the position whereat the light flux crosses the plane and the optical axis is given by l=d tan $\theta_2$. Accordingly, by measuring this spacing l, the distance d between the planes Q and P can be obtained. Thus, it is possible to correct the plane Q by the obtained spacing l.

FIG. 2 illustrates the principle for measuring the optical spacing between a mask 2 and a wafer 3.

Two divisional lights 4 and 5 from the point of intersection O between the optical axis of the imaging optical system 1 and the mask 2 overlap each other at the point of intersection A between the in-focus plane P and the optical axis. These two overlapped light fluxes are regularly reflected by the wafer and the reflected light flux 4 travels back along the path of the light flux 5 while the light flux 5 travels back along the path of the light flux 4. The two light fluxes again overlap each other at the point O. Assume that the wafer 3 has been disposed on the plane Q spaced apart a distance d from the in-focus plane P with the mask 2 and lens 1 remaining fixed. The light flux 4 is reflected by the wafer on the plane Q and reflected as indicated at 4'. The light flux 5 is likewise reflected as indicated at 5'. These reflected lights 4' and 5' travel toward the lens 1 as if they emanated from a plane P' spaced apart a distance $2d$ from the plane P and overlap each other at a point O" on the optical axis which is spaced apart a distance $2\beta^2 d$ from the point O. The two reflected lights 4' and 5' then intersect the mask 2 at positions each spaced apart a distance L from the optical axis. Observation of the overlapped condition of the two light fluxes may be accomplished by the use of a method of observing the light fluxes with a half-motor disposed between the wafer 3 and the imaging optical system 1, a method of observing the light fluxes with a half-mirror disposed between the mask 2 and the imaging lens 1, or a method of observing the light fluxes through the mask 2. In the case of a printing apparatus employing the imaging lens 1 to form a reduced mask image, the second and third method are preferable because the amount of deviation between the two light fluxes is enlarged by the magnification of the imaging lens 1. That is, assuming that two imaging light flux have angles $\pm\theta_2$ on the wafer side as shown in FIG. 1, the deviation L on the mask surface is expressed as $$L \approx 2d \cdot \beta^2 \cdot \tan(Q_2/B) \approx 2d\beta \tan\theta_2 = 2\beta l$$

This L is the amount to be detected. For example, if $\tan\theta_2 = \frac{1}{4}$ and $\beta = 10$ and $d = 1$ μm, then for the width of $$L = 5 \text{ μm},$$

the amount to be detected is 2L and thus, a deviation of 10 μm may be detected on the mask surface. This, if imaged on an enlarged scale, is an amount that can be easily detected by an image sensor or a position detecting element.

Figure 3:
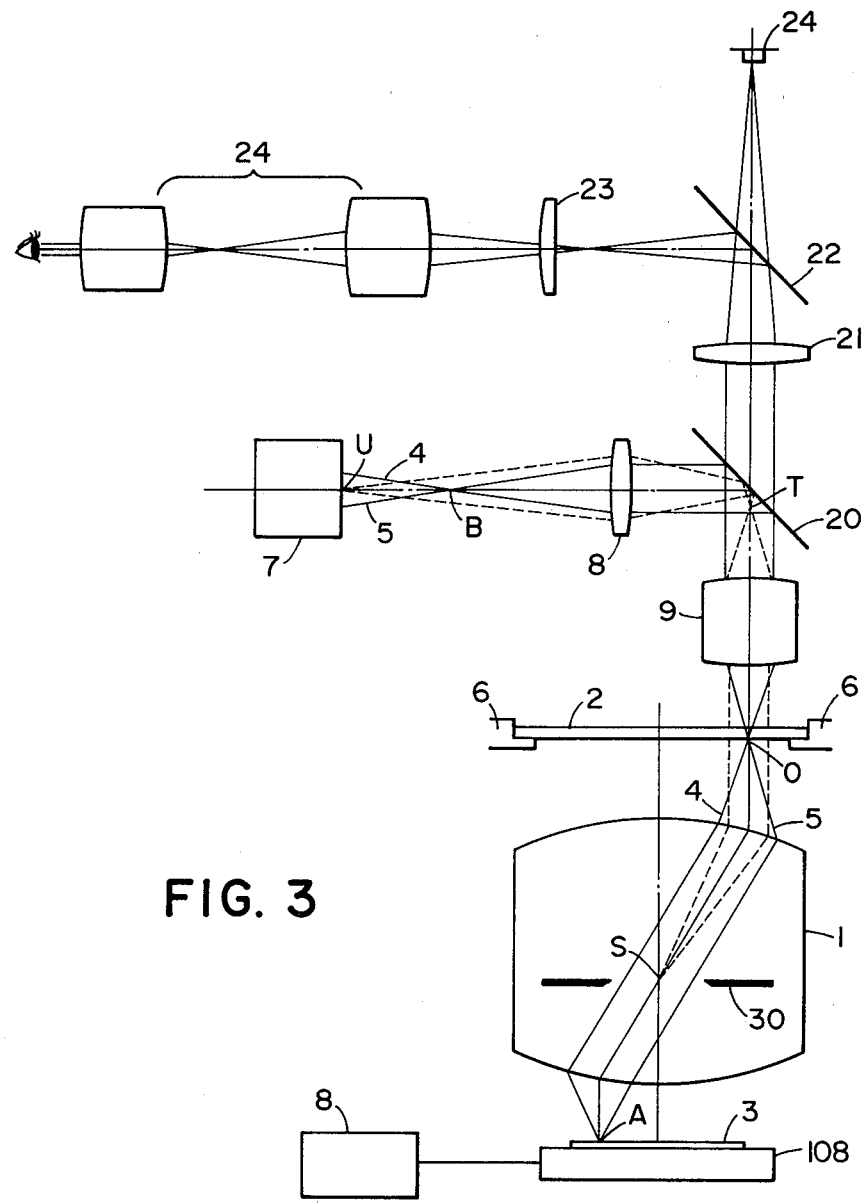
FIG. 3 shows the optical arrangement of the printing apparatus of the present invention.

In the description of FIGS. 1 and 2, the two light fluxes have been made to impinge on the wafer surface from directions symmetrical with respect to the optical axis and the detection plane has been set to the neighborhood of the point of intersection between the optical axis and the wafer, whereas the detection plane may be spaced apart from such position, i.e., when the detection is carried out off-axis. In this case, however, the light regularly reflected by the wafer surface must be reversely incident on the lens 1 and therefore, the angle of incidence of the detection light and the position of the detection plane are limited if the principal ray of the detection plane does not reach the wafer perpendicularly. To alleviate such limitations to some extent, the telecentric lens should desirably be used as the imaging lens. In that case, the telecentric lens need not always be a both-side telecentric lens, but may be a one-side telecentric lens. FIG. 3 shows the optical arrangement of a printing apparatus using a both-side telecentric reduction projection lens and having a two-flux type in-focus detecting device for detecting the amount of deviation between two light fluxes through a mask.

Designated by 1 is a both-side telecentric reduction lens. Denoted by 2 is a mask carried on a fixed mask carrier 6. Designated by 108 is a wafer carrier movable in directions x, y and Q by a drive motor 8. Denoted by 7 is a detection light generator which generates two light fluxes 4 and 5 symmetrically angled with each other with respect to the optical axes of lenses 8, 9.

Figure 4A:
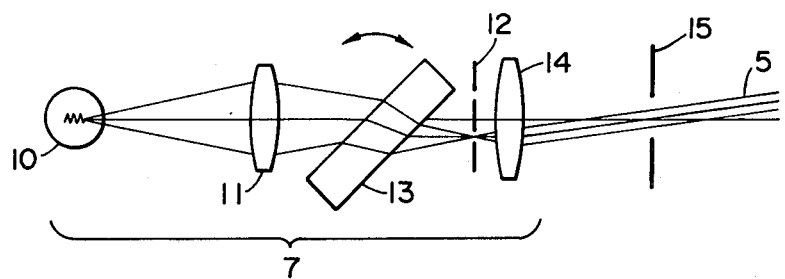
FIG. 4 illustrates the pupil splitting optical system of FIG. 3.
Figure 4B:
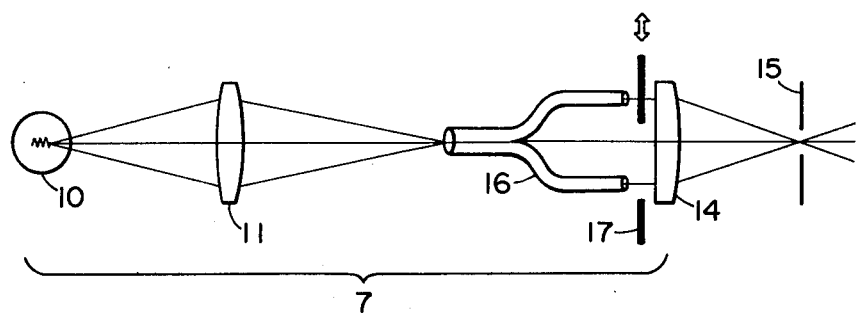

Examples of the generator 7 are shown in FIG. 4. In FIG. 4A, reference numeral 10 designates a light source, reference numeral 11 denotes a lens for forming the image of the light source on the surface of a two-opening mask 12, reference numeral 13 designates a parallel planar plate rotatable in the direction of arrow to vibrate the formed image of the light source, and reference numeral 14 denotes a lens for re-imaging the image of the point light source on the surface of a one-opening mask 15. By rotation of the parallel planar plate 13, the image of the point light source is alternately formed in the openings of the two-opening mask 12. The opening in mask 15 is located at the focal point of the lens 14, whereby there are obtained detection lights 4 and 5 having inclinations with respect to the optical axis. FIG. 4B shows an example which uses a two-emergence surface fiber. The light source 10 is imaged on the incidence surface of the fiber 16 by the lens 11. This light emerges from the two emergence surfaces of the fiber 16. These lights are directed to a one-opening mask 15 by the lens 14. This one-opening mask is positioned on the focal plane of the lens 14. Accordingly, the lights having emerged from the respective openings cross each other in the opening of the mask 15. Thus, two detection lights are obtained. In order to modulate the light, a light-intercepting plate 17 movable in the direction of arrow may be disposed on the emergence surfaces of the fiber 16.

Turning back to FIG. 3, B is a point whereat the detection lights 4 and 5 from the detection light generator 7 intersect each other on the optical axis and the position of the mask 15 corresponds to this point. This point is in conjugate relation with the point O on the mask 2 with respect to the lenses 8, 9. Accordingly, the detection lights 4 and 5 look as if they emanated from the point O on the mask. Thus, the point O provides a reference point for measuring the optical spacing between the mask 2 and the wafer 3.

Figure 5:
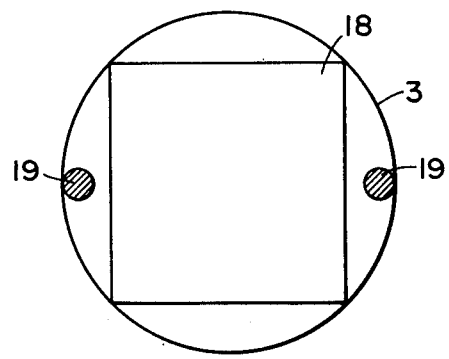
FIG. 5 shows the surface of a wafer.

The detection lights 4 and 5 having emanated from this point O enter the projection lens 1 and thence travel toward the wafer 3. In FIG. 5, there is shown the positional relation between the wafer 3 and these detection lights. As is apparent from FIG. 5, the detection lights are directed to non-circuit portions 19 outside of a portion 18 in which the circuit pattern of the mask 2 is formed.

The chromatic aberration of lens 1 can be treated as an offset amount. In mirror projection systems, there is no chromatic aberration so that offset correction is not necessary. The following explanation assumes that no chromatic aberration is present for simplicity.

The detection lights 4, 5 having impinged on the wafer 3 travel again toward the mask 2 as previously described in connection with FIG. 2. If the system is in focus, the detection lights 4, 5 will coincide with each other on the mask surface and if the system is out of focus, the detection lights will not coincide.

This coincidence or lack of coincidence may be detected by means of an observation optical system or a deviation detecting and reading optical system disposed on the mask side.

The observation optical system will now be described.

The detection lights from the mask are directed to the observation system through the lens 9, half-mirror 20, lens 21 and half-mirror 22. A field lens 23 is disposed near the plane conjugate with the mask 2 with respect to the lenses 9 and 21. The state images of the detection lights 4, 5 re-imaged on this field lens may be observed through a microscope 24.

The deviation detecting and reading optical system comprises a photo-array sensor 24 such as CCD disposed on the mask image plane by the lenses 9 and 21. The amount of deviation L shown in FIG. 2 is read by this photo-array sensor 24. By the use of the read amount of deviation L and from the previous equation, the out-of-focus distance d is obtained and the wafer carrier 108 is automatically moved in the direction of the optical axis. Whether the out-of-focus distance d is in the direction toward the lens 1 or in the opposite direction can be judged by detecting the state of phase in a case where the detection light generator emitting the detection light is used.

In the optical system of FIGS. 3 and 4, the surfaces 12, 17 of the detection light generator and the pupil plane of the lens 1 are in conjugate relation with each other. This is for preventing vignetting of the detection lights by the lens 1.

Figure 6:
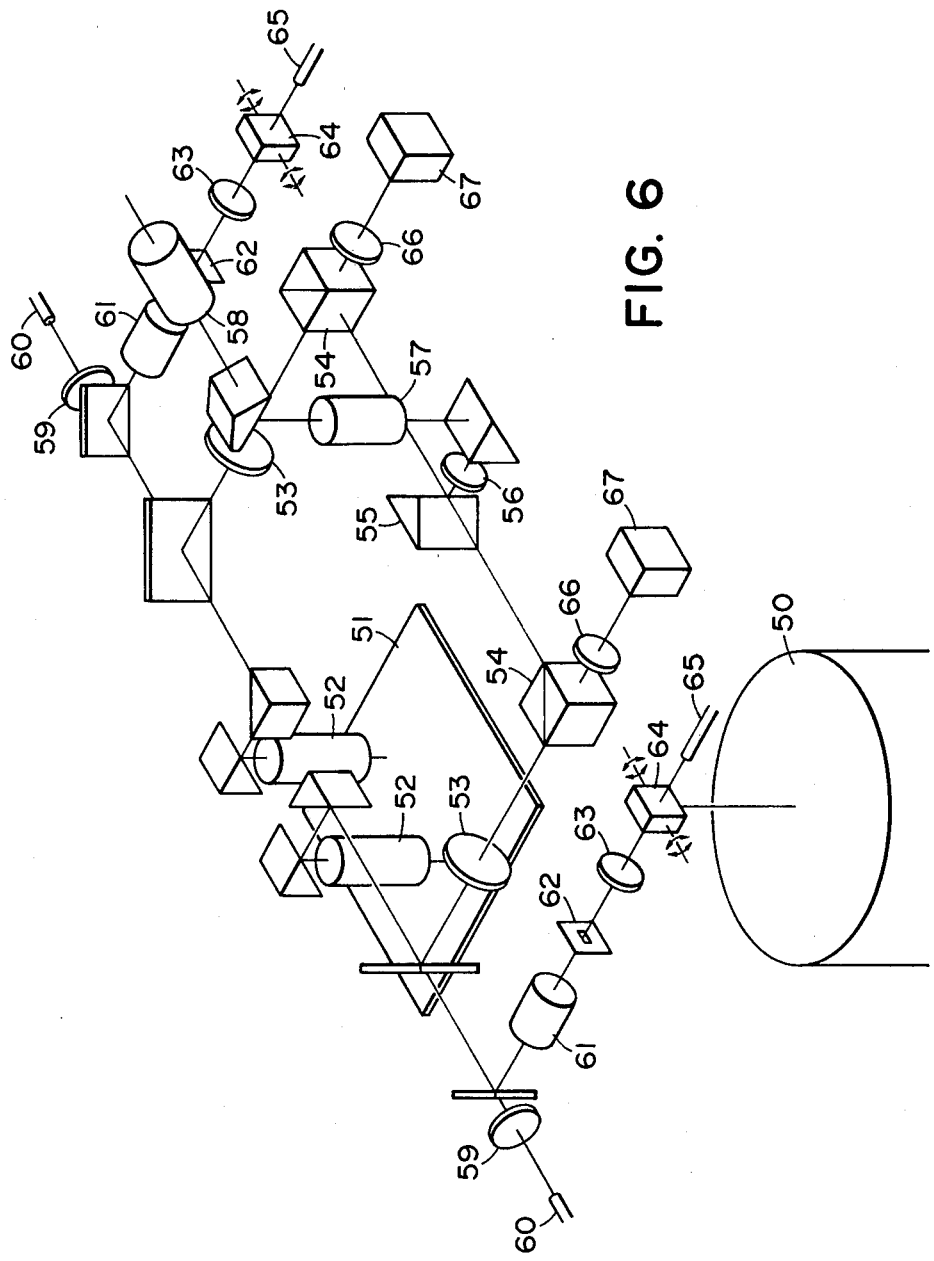
FIG. 6 shows a second embodiment of the present invention.

FIG. 6 shows an arrangement in which the present invention is actually constructed by an alignment scope. In FIG. 6, reference numeral 50 designates an imaging optical system for forming the image of a mask 51 on a wafer, not shown. Reference numeral 52 denotes an objective lens and reference numeral 53 designates a relay lens. By the combination of these two lenses, the image of the mask is once formed near a view field splitting prism 55. Since the images in the left and right observation areas are formed near the view field splitting prism 55, observation in the split field becomes possible. Reference numeral 56 designates a field lens, reference numeral 57 denotes an erector, and reference numeral 58 designates an eyepiece. A lens 59 and a fiber 60 correspond to a light source for sighting light. On the other hand, designated by 61-65 is the optical system of the present invention. At the position 62, a slit is made conjugate with the mask by the lenses 52 and 61. On the other hand, in this system, the light from the light source is directed by the fiber 65, the end face of which is conjugate with the position of the pupil of the imaging optical system 50 through the lens system 63-52. In the present embodiment, a parallel planar plate 64 is disposed between 65 and 63 and this effects vibratory movement about a certain axis like the vibratory plate of a photoelectric microscope to thereby move the apparent position of the fiber. The position of the illuminating light beam is varied by vibration of this parallel planar plate and, if the manner of movement of the image is grasped by way of the previously discussed principle, the focus condition of the system can be known. The monitor of the focus condition is directed to another light path by a beam splitter 54 and is accomplished by an image sensor 67. Where the imaging optical system 50 has no chromatic aberration like a mirror system widely spaced wavelength ranges can be employed for 60 and 65. Where the imaging optical system includes a lens and has chromatic aberration, it will be convenient to employ the same wavelength for 60 and 65. However, this is not a requisite condition, but if the position of 62 is purposely deviated from the conjugate surface of the mask with the chromatic aberration of the imaging optical system taken into account, different wavelengths from the projection lens 1 may be employed for 60 and 65.

What I claim is:

1. A printing apparatus having an in-focus detector, comprising:
    a mask carrier for supporting a mask thereon;
    a wafer carrier for supporting a wafer thereon;
    an imaging optical system for projecting the image of the mask onto the wafer;
    an optical system for directing to the wafer through said imaging optical system a detection light having a predetermined inclination with respect to the optical axis of said imaging optical system; and
    means for observing therethrough the position of the reflected detection light from the wafer;
    whereby in-focus condition may be detected depending on whether or not the position of said detection light is a predetermined position.

2. A printing apparatus having an in-focus detector, comprising:
    a mask carrier for supporting a mask thereon;
    a wafer carrier for supporting a wafer thereon;
    an imaging optical system for projecting a reduced image of the mask onto the wafer;
    an optical system for directing to the wafer through said imaging optical system a detection light having a predetermined inclination with respect to the optical axis of said imaging optical system; and
    means for observing therethrough the position of the detection light reflected by the wafer and again passed through said imaging optical system.

3. A printing apparatus having an in-focus detector, comprising:
    a mask carrier for supporting a mask thereon;
    a wafer carrier for supporting a wafer thereon;
    an imaging optical system for projecting the image of the mask onto the wafer;
    an optical system for causing a detection light having a predetermined inclination with respect to the optical axis of said imaging optical system at the wafer to pass through a predetermined location of the mask and through said imaging optical system and for directing the detection light to the wafer; and
    means for observing therethrough the position of the reflected detection light from the wafer.

4. A printing apparatus having an in-focus detector, comprising:
    a mask carrier for supporting a mask thereon;
    a wafer carrier for supporting a wafer thereon;
    an imaging optical system for projecting the image of the mask onto the wafer, said imaging optical system being telecentric at least on one side thereof;
    an optical system for directing to a position of the wafer, off the optical axis, through said imaging optical system a detection light having a predetermined inclination with respect to the optical axis of said imaging optical system; and
    means for observing therethrough the position of the reflected detection light from the wafer.

* * * * *